United States Patent [19]
Lee et al.

[11] Patent Number: 5,416,033
[45] Date of Patent: May 16, 1995

[54] INTEGRATED CIRCUIT AND MANUFACTURE

[75] Inventors: Kuo-Hua Lee; Chung-Ting Liu, both of Wescosville; Kurt G. Steiner, Bethlehem; Chen-Hua D. Yu, Allentown, all of Pa.

[73] Assignee: AT&T Corp., Murray Hill, N.J.

[21] Appl. No.: 192,486

[22] Filed: Feb. 7, 1994

Related U.S. Application Data

[63] Continuation of Ser. No. 976,049, Nov. 13, 1992, abandoned.

[51] Int. Cl.⁶ .......................................... H01L 21/265
[52] U.S. Cl. ........................................ 437/41; 437/27; 437/35; 437/36; 437/44; 437/80; 437/913
[58] Field of Search ............... 437/41, 40, 42, 43, 437/44, 913, 35, 36, 80, 27, 28, 29, 31; 148/DIG. 105, DIG. 106

[56] References Cited

U.S. PATENT DOCUMENTS

| | | |
|---|---|---|
| 4,198,250 | 4/1980 | Jecmen . |
| 4,330,931 | 5/1982 | Liu . |
| 4,640,000 | 3/1987 | Sato .................................. 437/29 |
| 5,013,691 | 5/1991 | Lory et al. ........................ 437/238 |

FOREIGN PATENT DOCUMENTS

| | | | |
|---|---|---|---|
| 57-204148 | 12/1982 | Japan | 437/80 |
| 58-219765 | 12/1983 | Japan | 437/51 |
| 59-19349 | 1/1984 | Japan | 437/913 |
| 60-121765 | 6/1985 | Japan | 437/27 |
| 60-263468 | 12/1985 | Japan | 437/29 |
| 62-163374 | 7/1987 | Japan | 437/27 |
| 63-261755 | 10/1988 | Japan | 437/40 |
| 0395936 | 4/1991 | Japan | 437/29 |

OTHER PUBLICATIONS

Ghandhi "VLSI Fabrication Principles"; pp. 321-325; 1983.
Silicon Processing for the VLSI ERA; Wolf et al; vol 1; 1986; pp. 183-184; 532-533.
Silicon Processing for the VLSI ERA; Wolf vol 2; 1986, pp. 196-199.
"Deep-Submicrometer Large-Angle-Tilt Implanted Drain (LATID) Technology," T. Hori et al., *IEEE Transactions on Electron Devices*, vol. 39, No. 20, Oct. 1992, pp. 2312-2324.
"A new ultrafine groove fabrication method utilizing electron cyclotron resonance plasma deposition and reactive ion etching," S. Ohki et al., *J. Vac. Sci. Technol.* B6(2), Mar./Apr. 1988, pp. 533-536.
"Halo Doping Effects in Submicron DI-LDD Device Design," C. F. Codella et al., IEEE 1985, IEDM 85, pp. 230-233.

*Primary Examiner*—Tom Thomas
*Assistant Examiner*—Michael Trinh
*Attorney, Agent, or Firm*—John T. Rehberg

[57] ABSTRACT

A method of semiconductor integrated circuit fabrication including a technique for forming punch-through control implants is disclosed. After gate formation, a dielectric is formed which covers the gate and exposed portions of a semiconductor substrate. The dielectric is formed by a process which makes that portion of the dielectric adjacent the gate sidewalls more vulnerable to wet etching than those portions of the dielectric which are adjacent the top of the gate and the exposed substrate. The dielectric is then subsequently etched to form channels adjacent the gate which exposed the substrate and served to collimate an ion implantation beam. The remaining portions of the dielectric may then be stripped away and conventional procedures employed to form source and drain. Illustratively, the dielectric is formed from TEOS to which NF₃ is added during the deposition process. The addition of NF₃ makes that portion of the dielectric which forms adjacent the gate sidewalls particularly vulnerable to hydrofluoric acid etching while those portions of the dielectric covering the substrate and covering the gate are not so vulnerable.

5 Claims, 1 Drawing Sheet

INTEGRATED CIRCUIT AND MANUFACTURE

This application is a continuation of application Ser. No. 07/976,049, filed on Nov. 13, 1992, now abandoned.

TECHNICAL FIELD

This invention relates to methods for manufacturing integrated circuits, and more particularly to methods for forming punch-through control implants in MOSFETs.

BACKGROUND OF THE INVENTION

As integrated circuit geometries become increasingly smaller, an abnormal mode of operation, sometimes termed "avalanche breakdown" or "punchthrough" occurs. When punch-through occurs, the drain current is, essentially, no longer under the control of the gate.

For example, in an n-channel transistor built upon a p-type substrate, the source and drain regions are both n-type. Essentially, one observes two back-to-back diodes when the transistor is off. If the channel is short enough and the drain voltage high enough, the depletion region of the n-p diode associated with the drain will eventually touch the source. Uncontrollable transistor leakage results.

Designers have sought to minimize punch-through effects by implanting appropriate dopant species into the channel region. For example, in an n-channel device (i.e., a device with n-type source and drains) a p-type dopant species is often implanted into the channel region adjacent the source and drain. The implant, termed a punch-through control implant, helps to prevent the undesirable phenomena described above. Various approaches have been employed in the past to perform punch-through control implanting. One approach involves the formation of the gate with flanking spacers. The gate, together with the source and drain, is subsequently salicided. Then the spacers flanking the gate are removed. A punch-through control implant species is directed toward the channel region through that portion of the substrate left exposed by the removed spacer. The silicide over the gate, source and drain regions stops or retards the dopant species, thereby helping to insure that the punch-through control implant is properly positioned near the channel.

However, the above approach presents a variety of practical problems in manufacture. When p-type dopants are employed, the dopant tends to degrade the silicide. Furthermore, the thickness of the silicide is critical to proper absorption of the p-type dopant over the gate, source and drain. (Thicker silicides are desirable for stopping the p-type dopant from penetration. However, thicker silicides may induce junction leakage.) Finally, it is difficult to selectively and completely strip the spacer which flanks the gate.

SUMMARY OF THE INVENTION

Illustratively the above problem is alleviated by a method of semiconductor circuit fabrication which includes:
forming a gate overlying a portion of a substrate, the gate having sides which are generally perpendicular to the substrate, while portions of the substrate are exposed. Then a blanket dielectric layer is formed over the gate and substrate. The dielectric is etched to remove the dielectric from the sides of the gate while permitting a portion of the dielectric to remain on top of the gate. Then the substrate is exposed to a dopant species.

DETAILED DESCRIPTION

Figure 1:
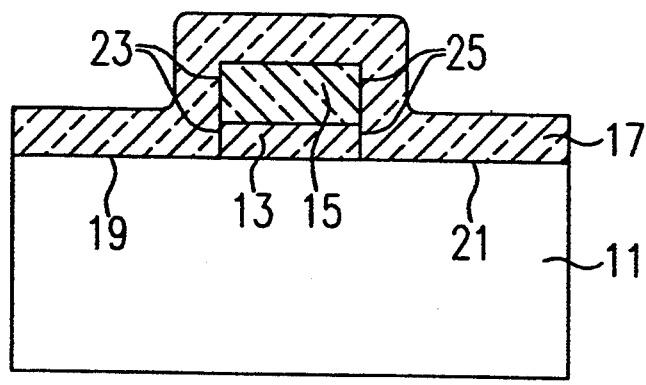
FIGS. 1, 2, and 3 are cross-sectional views of partially fabricated integrated circuits which schematically represent an illustrative embodiment of the present invention.

In FIG. 1 reference numeral 11 denotes a substrate which may, typically, be silicon, doped silicon, epitaxial silicon, or another semiconductor. In general, the term substrate refers to any material upon which other material layers may be formed. In an illustrative embodiment, reference numeral 11 denotes a p-type silicon crystalline substrate. Reference numeral 13 denotes a gate dielectric which may be, typically, silicon dioxide, or perhaps silicon oxynitride. Reference numeral 15 denotes a conductive material which is, illustratively, polysilicon. Reference numerals 13 and 15, taken together, comprise a gate structure. Optionally, a silicide may be formed on top of conductor 15. Reference numeral 17 denotes a dielectric which is blanket-deposited over the gate comprised of dielectric 13 and conductor 15 and over the otherwise exposed portions 19 and 21 of substrate 11.

For example, the thickness of dielectric 13 may be 20 to 200 Å, preferably 100 Å. The thickness of conductor 15 may be 0.1 to 0.5 μm, preferably 2000 Å. Conductor 15 may be capped with a silicide layer, if desired. Layer 17 may be, for example, a silicon dioxide based dielectric formed from TEOS and deposited to a thickness of 0.2 to 0.8 μm, preferably 5000 Å.

However, during the deposition of dielectric layer 17, $NF_3$ is added during the deposition process. Typically, for example, dielectric 17 may be formed in a chemical vapor deposition apparatus, such as the Applied Materials 5000, manufactured by Applied Materials Corporation, Santa Clara, Calif. For example, a TEOS flow of 300 to 500 sccm, an oxygen flow of 0 to 100 sccm, and an $NF_3$ flow of 5 to 20 sccm may be employed. A typical deposition pressure would be in the range of 0.5 to 5.0 Torr. A temperature range from 250° C. to 700° C. is in the range of 0.5 to 5.0 Torr. A temperature range from 250° C. to 700° C. is desirable. The plasma discharge is desirably between wpp to 400 watts at 13.56 MHz.

It is hypothesized that the addition of $NF_3$ to the TEOS deposition process "poisons" (with fluorine) the deposition of dielectric along the sidewalls 23 and 25 of the vertical topographic feature comprising the gate 15 and 13. Consequently, that portion of dielectric 17 which does adhere to sidewalls 23 and 25 is more vulnerable to subsequent wet etching.

Figure 2:
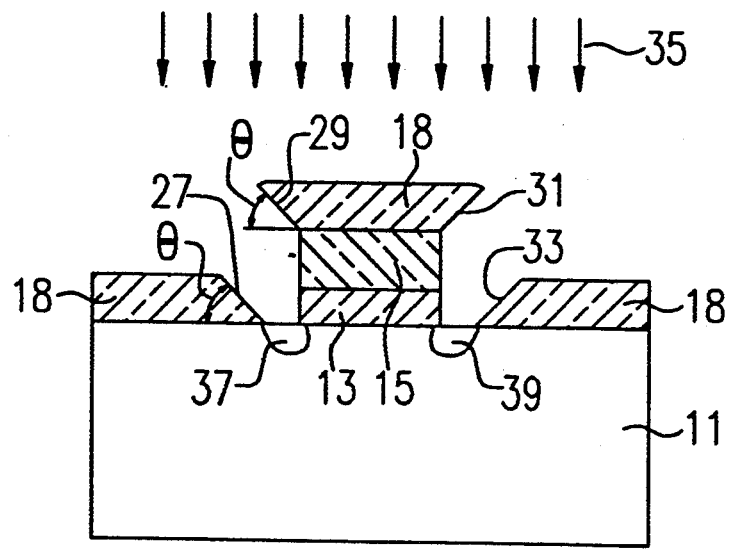

FIG. 2 illustrates the structure of FIG. 1 after it has been dipped in a wet etch solution which preferentially removes that portion of dielectric 17 adjacent sidewalls 23 and 25. Typically, for example, a 15:1 hydrofluoric acid solution performs a satisfactory etch. It will be noted that a channel, for example, that defined by sidewalls 27 and 29, is formed adjacent the gate comprised of conductor 15 and dielectric 13. Sidewalls 27 and 29 are slanted in FIG. 2 from a horizontal by an angle $\theta$, which is typically between 30 and 50 degrees. The channels defined by sidewalls 27–29 and 31–33 form collimating channels which will serve to direct subsequently implanted ion species.

After the formation of the collimating channels, a blanket p-type implant, denoted by reference numeral 35, is performed. Typically, an implant of boron ions at a dose 1E12 at 50–160 KEV may be performed.

Regions of concentrated p-type dopants, denoted by reference numerals 37 and 39, which will subsequently serve as punch-through control implants, are thereby formed. The remaining portions of dielectric 18 are stripped away.

Figure 3:
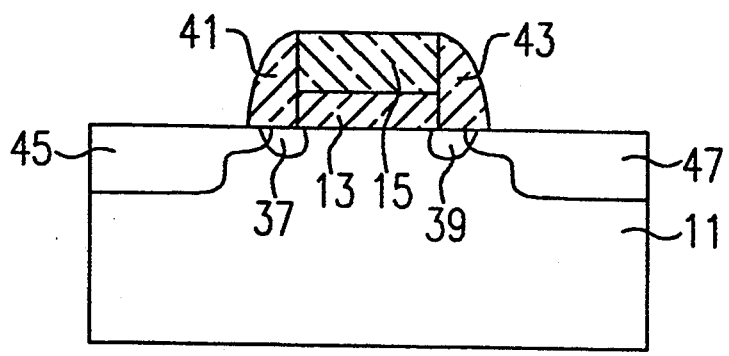

Subsequent processing may be in accordance with conventional semiconductor integrated circuit fabrication techniques. By means of example, but not limitation, in FIG. 3 spacers 41 and 43 may be performed together with lightly doped drain (LDD) implantations 45 and 47 which constitute the source and drain of the transistor. If desired, conventionally shaped (that is, non-LDD) sources and drains may be formed with or without spacers.

We claim:

1. A method of semiconductor integrated circuit fabrication comprising:
    forming a gate overlying a portion of a substrate;
    said gate having a top and having sides which are generally perpendicular to said substrate;
    portions of said substrate being exposed;
    forming a blanket dielectric layer over said gate and the exposed portions of said substrate;
    etching said dielectric layer to remove said dielectric layer from said sides of said gate, while permitting a portion of said dielectric layer to remain on said top of said gate;
    said etching step also removing a portion of said dielectric layer from said substrate;
    exposing said substrate to a dopant species, said portion of said dielectric layer remaining on said top of said gate having a first side which is slanted with respect to said substrate and that portion of said dielectric layer remaining on said substrate having a second side which is slanted with respect to said substrate, said first and second sides thereby forming a channel for directing said dopant, species toward said substrate.

2. The method of claim 1 in which said blanket dielectric layer is formed in a reactor utilizing TEOS and NF$_3$.

3. The method of claim 1 in which said etching step utilizes hydrofluoric acid.

4. The method of claim 1 in which said exposing of said substrate to a dopant species is an implantation of boron ions.

5. The method of claim 1 in which, after said exposing of the substrate to a dopant species, the remaining portions of said dielectric layer are stripped away.

* * * * *